FIG. 1
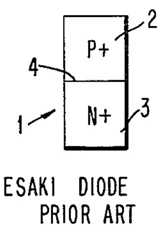
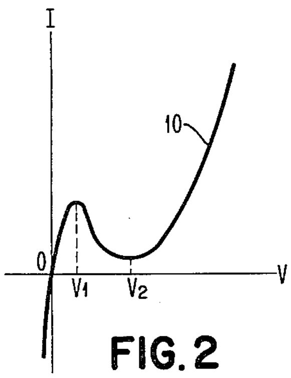
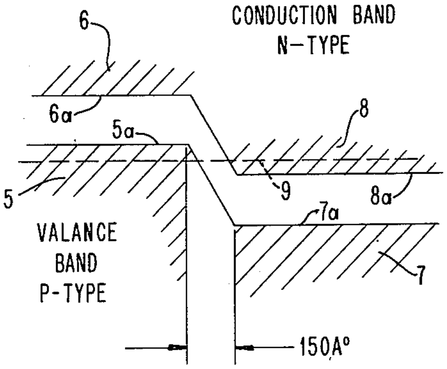
FIG. 3
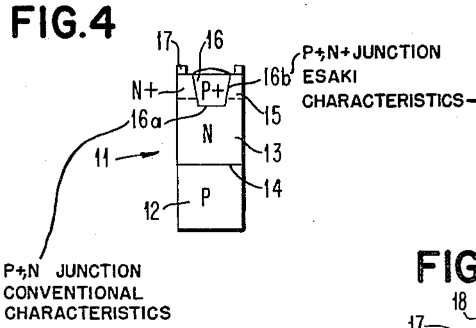
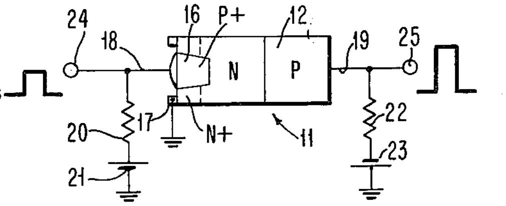
FIG. 5
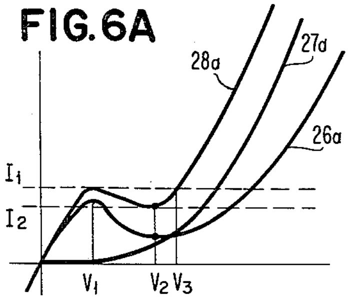
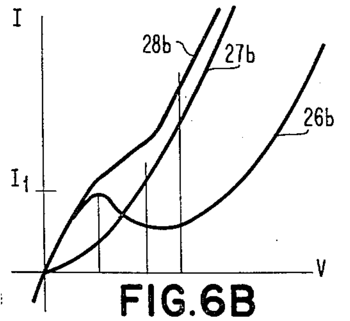
FIG. 6B
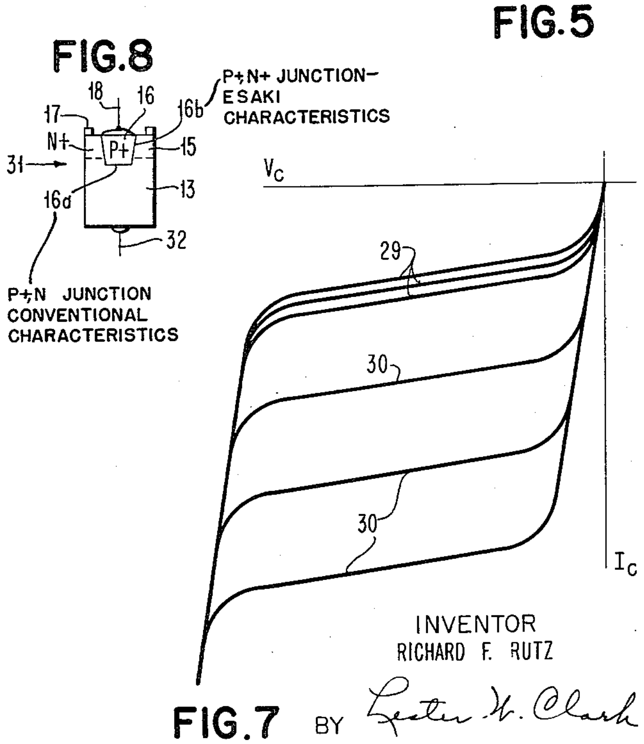
FIG. 7
INVENTOR
RICHARD F. RUTZ
BY Lester H. Clark
ATTORNEY United States Patent Office 3,079,512

Patented Feb. 26, 1963

3,079,512

SEMICONDUCTOR DEVICES COMPRISING AN ESAKI DIODE AND CONVENTIONAL DIODE IN A UNITARY STRUCTURE

Richard F. Rutz, Fishkill, N.Y., assignor to International Business Machines Corporation, New York, N.Y., a corporation of New York Filed Aug. 5, 1959, Ser. No. 831,818
10 Claims. (Cl. 307—88.5)

This invention relates to semiconductor devices utilizing the principle of the Esaki diode, methods for making such devices, and circuits employing such devices.

An article in the Physical Review for January 1957, on pages 603–604, entitled, "New Phenomenon in Narrow Germanium P-N Junctions" by Leo Esaki, describes a semiconductor structure which has come to be known as an "Esaki diode," sometimes alternatively referred to as a "tunnel diode." As described by Esaki, this diode is a PN junction device in which the junction is very thin, i.e., narrow, in the currently accepted conventional terminology (on the order of 150 Angstrom units or less) and in which the semiconductor materials on both sides of the junction have high impurity concentrations (of the order of $10^{19}$ net donor or acceptor atoms per cubic centimeter for germanium).

The Esaki diode has several unusual characteristics. One is that the reverse impedance is very low, approaching a short circuit. Another is that the forward potential-current characteristic has a negative resistance region beginning at a small value of forward potential (on the order of .05 volt) and ending at a larger forward potential (of the order of 0.2 volt). The potential value at the low potential end of this negative resistance region is very stable with respect to temperature. It does not vary appreciably over a range of temperatures varying from a value near zero degrees K. to several hundred degrees K. At potential values outside the limited range described above, forward resistance of the Esaki diode is positive.

The Esaki article identified germanium as a semiconductor material having this property, and did not identify the impurity materials with which the phenomenon was observed. Further research has led to the belief that this phenomenon can be observed with any semiconductor material at some temperature level, providing suitable donor and acceptor materials are available. The donor and acceptor materials must be capable of alloying into the matrix material with sufficient concentration to make the extrinsic material degenerate.

In this specification, a P type semiconductor is said to be degenerate if the Fermi level is either within the valence band or, if outside the valence band, it differs from the valence band edge of the energy gap by an energy not substantially greater than $kT$, where $k$ is Boltzmann's constant and T is the temperature in degrees K. Similarly, an N type semiconductor is said to be degenerate if the Fermi level is either within the conduction band or, if outside the conduction band, it differs from the conduction band edge of the energy gap by an energy not substantially greater than $kT$.

In order that a semiconductor diode may have Esaki diode characteristics, the P and N type materials must be such that the valence band of the P type material overlaps the conduction band of the N type material. It is also necessary that the junction between the P and N type materials be very thin, i.e., on the order of 150 Angstrom units or less. Furthermore, it is preferable that the top of the valence band be above the Fermi level on the P side, and that the bottom of the conduction band be below the Fermi level on the N side. It has now been found that acceptor materials which may be introduced into germanium with sufficient concentrations to produce the Esaki effect include gallium, aluminum, boron and indium. Suitable donor materials for germanium include arsenic and phosphorus.

An object of the present invention is to provide a novel semiconductor device having at least one junction with a portion of that junction having current-potential characteristics similar to those of an Esaki diode, and another portion of the junction having current-potential characteristics similar to those of a conventional diode.

Another object is to provide an improved semiconductor device of the type described, in the form of a transistor in which the Esaki diode characteristics appear at the junction between the collector and base electrodes.

Another object is to provide an improved semiconductor device of the type described, in the form of a transistor in which the Esaki diode characteristics appear at the junction between the emitter and base electrodes.

Another object is to provide an improved diode of the type described.

A further object is to provide an improved amplifier circuit employing a three-electrode semi-conductor device having Esaki diode characteristics.

Another object is to provide an improved switching circuit employing a semiconductor device of the type described.

Another object is to provide an improved level setting circuit employing an improved semiconductor device of the type described.

Another object of the invention is to provide improved methods for manufacturing semiconductor devices of the type described.

The foregoing and other objects of the invention are attained in the structures, methods and circuits described herein.

One of the improved semiconductor devices described herein is essentially a transistor including a body of semiconductor material having first and second regions of opposite extrinsic conductivity types separated by a barrier junction, and a third region adjoining the second region and of the same conductivity type but with an impurity concentration high enough to make it degenerate. A fourth region, also degenerate, adjoins the second and third regions, and is of the opposite conductivity type to those regions. The junction between the fourth and second regions has conventional diode characteristics, while the junction between the fourth and third regions has Esaki diode characteristics. Electrodes are connected to this semiconductor device at the fourth region, the third region and the first region, serving respectively as emitter, base and collector electrodes.

The Esaki diode between the emitter and base electrodes effectively shunts the emitter junction at low emitter current values, so that changes in the emitter current in that operating region do not affect the collector current. Higher emitter potentials shift the operating point along the Esaki diode characteristic and provide amplification of the input signals at the collector electrode in a typical transistor fashion.

A circuit utilizing a semiconductor device of the type described may be utilized as an amplifier, providing its emitter is biased beyond the negative resistance region of the Esaki diode characteristic. If this emitter is biased to a point within or below the negative resistance region, such a circuit may serve as a switch or as a level setter.

Another form of semiconductor structure described herein is a somewhat different transistor including a semiconductor body having the four regions described above and a fifth region of opposite conductivity type to the first region and located on the opposite side thereof from the second region. This semiconductor body may have electrodes attached to its fifth, first and fourth regions, which serve as emitter, base and collector electrodes respectively. The semi-conductor device acts somewhat as a transistor having a PN hook collector, with the Esaki diode as part of the PN hook. A semiconductor device of this type, when connected in a circuit with suitable biasing supplies, may serve as a non-linear amplifier having an alpha less than 1 for low values of input current, at which time the Esaki diode effectively shunts the hook, and an alpha greater than 1 for higher values of input current which are effective to saturate the shunting effect of the Esaki diode and introduce the high alpha effect of the PN hook.

Another embodiment of the invention described herein is a diode having three regions corresponding to the second, third and fourth regions in the transistors described above. As in the transistors, the diode has potential-current characteristics having a marked shift at the upper end of the Esaki negative resistance region. It is useful to detect variations in a potential beyond a threshold value, or as a photosensitive device, to detect variations in illumination.

One method of making a four region semiconductor body of the type described starts with a body of nondegenerate semi-conductor material of one extrinsic conductivity type. Into one surface of this body is diffused a first impurity material effective to induce therein extrinsic conductivity of the opposite type. This diffusion is continued until the material in a layer adjacent the surface becomes degenerate while an underlying layer remains nondegenerate. The body then includes two nondegenerate regions of opposite conductivity types and a degenerate region adjacent and of the same conductivity type as one of those two regions. Into a portion of the surface of this degenerate region there is then alloyed a second impurity material effective to induce therein conductivity of the opposite type. This alloying is continued until this latest region is degenerate and extends through the first degenerate region and adjoins the nondegenerate region of opposite conductivity type. This last alloying step is preferably carried out in a rapid heating and cooling cycle so that the junction between the two degenerate regions is very narrow.

Another method of making a transistor body of the type described starts with a PN junction diode of nondegenerate semiconductor material. Into a surface of one of the two regions of the diode there is alloyed a first impurity material effective to increase the concentration of impurities in that one region. That alloying is continued until a first layer adjacent the surface is degenerate while a second layer between the first layer and the junction remains nondegenerate. The excess impurity material is etched away from the surface. A second impurity material is then alloyed into a portion of the etched surface. This second material is effective to induce conductivity of the opposite type in a third region of the body adjacent the surface portion. The last-mentioned alloying is continued until the last-mentioned region is degenerate and extends through the first layer and adjoins the second layer.

The methods described above are for making four region transistor bodies of the type described. If five region transistor bodies are to be made, the starting materials for these methods are modified to include the fifth region. If diodes are to be made, either the starting materials are modified to omit the region not required, or that region may be removed after the process is complete.

Other objects and advantages of the invention will become apparent from a consideration of the following specification and claims taken together with the accompanying drawings.

In the drawings:

FIG. 1 is a diagrammatic illustration of an Esaki diode of the prior art;

FIG. 2 is a graphical illustration of a typical potential-current characteristic of an Esaki diode;

FIG. 3 is an energy diagram of the junction in the Esaki diode of FIG. 1;

FIG. 4 is a diagrammatic illustration of one form of transistor device embodying certain features of the invention;

FIG. 5 is a wiring diagram illustrating a circuit utilizing the device of FIG. 4;

FIGS. 6A and 6B are graphical illustrations of the emitter potential-current characteristics of the device of FIG. 4;

FIG. 7 is a graphical illustration of the collector potential-current characteristics of the device of FIG. 4;

FIG. 8 is a diagrammatic illustration of a diode embodying certain features of the invention;

*FIGS. 1 to 3*

Figures 9, 10:
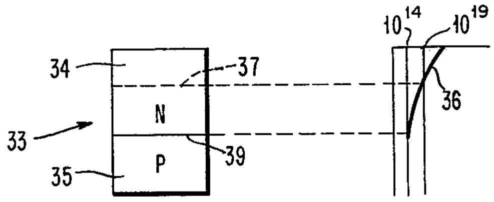
FIG. 9 is a diagrammatic illustration of an initial step in one process of constructing the device of FIG. 4.
FIG. 10 is a graphical illustration of the variation in impurity concentration in the element of FIG. 9.

These figures illustrate diagrammatically an Esaki diode and its principal operating characteristics. Such a diode comprises a body of semiconductor material, such as shown at 1 in FIG. 1, including a P+ region 2 and an N+ region 3, separated by a barrier junction 4. At least one of the two regions is of degenerate material. Preferably both are degenerate, but it is possible to get typical Esaki diode characteristics from a diode wherein one of the two regions is degenerate and the other is nearly so.

Referring to FIG. 3, there is shown an energy diagram in which the P type material has a valence band 5 with and upper edge *5a*, and a conduction band 6 with a lower edge *6a*. The N type material similarly has a valence band 7 with an upper edge *7a* and a conduction band 8 with a lower edge *8a*. The edges *5a—6a* and *7a—8a* define the energy gap in the materials.

The Fermi level is shown by the dotted line 9, and is within the valence band of the P type material and within the conduction band 8 of the N type material.

It is essential, to secure Esaki diode characteristics, that the conduction band of the N type material overlap the valence band of the P type material. It is also preferable that the Fermi level be within the valence band of the P type material and within the conduction band on the N type material. It must be within one of those two bands and at least close to (within $kT$) the other one. The diode must be produced by a method which will leave a barrier junction which is very narrow, i.e., of the order of 150 Angstrom units or less, as indicated in the diagram.

When the emitter material is germanium, the concentration of impurity materials must be at least of the order of $10^{19}$ net donor or acceptor atoms per cubic centimeter. Suitable acceptor materials include gallium, aluminum, boron and indium. Suitable donor materials include arsenic and phosphorous.

Silicon, indium, antimonide, gallium antimonide and gallium arsenide have been reported as suitable semiconductor materials. It is considered that any semiconductor material may be used to construct a junction having Esaki characteristics at some temperature range, provided donor and acceptor materials are available which permit sufficiently high concentrations of impurity atoms.

In general, semiconductors having a characteristic narrow energy gap will produce Esaki diodes having lower capacitances than those produced from semiconductors having a wider gap. Therefore, the narrow gap semiconductors should be more suitable for higher frequencies.

FIG. 2 shows at 10 a typical potential-current characteristic of an Esaki diode, taken at a particular temperature. Note that in the negative potential or reverse impedance region, the slope of the characteristic is very steep, indicating that the resistance of the diode is very low, being practically a short circuit. In the positive potential, or forward conduction region, the characteristic has a positive resistance between zero and the potential $V_1$, a negative resistance between the potentials $V_1$ and $V_2$ and a positive resistance above $V_2$. The Esaki diode is very stable as to the $V_1$ potential value, for a wide range of temperatures. The $V_2$ value may vary somewhat with temperature and the slopes of the various portions of the characteristic vary with the temperature. However, a negative resistance region at potentials just higher than $V_1$ is retained at all temperatures below the temperature at which the material becomes effectively intrinsic.

*FIGS. 4 to 7*

FIG. 4 illustrates diagrammatically a semi-conductor device 11 which may broadly be termed a transistor although it differs to some extent, both structurally and functionally, from transistors of the prior art. The transistor 11 has a generally cylindrical body, shown diagrammatically in cross-section with its cylindrical axis vertical, including a first P region 12 and second N region 13 separated from the P region 12 by a barrier junction 14. Both the regions 12 and 13 are of nondegenerate material. An annular region 15 adjoins the upper end of the region 13 and is formed of degenerate N type material, as indicated by the legend N+ in the drawing. A central region 16 is located within the region 15 and extends completely through the region 15 and adjoins the region 13. The region 16 is of P type degenerate material, as indicated by the legend P+ in the drawing. The region 16 is separated from the region 13 by a first barrier junction portion **16*a* which has potential-current characteristics typical of a conventional diode. The region 16 is separated from the region 15 by a barrier junction portion 16*b***, which has potential-current characteristics typical of an Esaki diode.

A broad area ohmic contact 17 is made to the region 15 and may extend completely around the periphery of that region.

An ohmic electrical contact 18 is made to the region 16, as shown in FIG. 5, and serves as an emitter electrode. The broad area contact 17 serves as a base electrode. Another ohmic electrical contact 19 is made to the region 12 and serves as a collector electrode.

In the circuit of FIG. 5, the base electrode 17 is grounded. A resistor 20 and a biasing battery 21 are connected in series between emitter electrode 18 and ground. A resistor 22 and a load supply battery 23 are connected in series between collector electrode 19 and ground. An input terminal 24 is connected to the emitter electrode 18. An output terminal 25 is connected to the collector electrode 19.

FIGS. 6A and 6B show the emitter potential-current characteristics of the parallel diode junctions between the emitter 18 and base electrode 17. These two figures show two alternative possibilities, FIG. 6A representing the case where the resistance of junction **16*a* in the $V_1$—$V_2$ region is less than the negative resistance of junction 16*b*. FIG. 6B, on the other hand, represents the case where the resistance of 16*a* is greater than the negative resistance of 16*b*. The characteristics 26*a* and 26*b* are typical Esaki diode characteristics and represent the variation in current flow through the junction portion 16*b* as the applied potential changes. The characteristics 27*a* and 27*b* are typical conventional diode characteristics and represents the variation in current flow through the junction portion 16*a* as the applied potential changes. Characteristics 28*a* and 28*b* represent, in their respective cases, the sums of the 26*a*+27*a* and 26*b*+27*b*** curves, and thus represent the actual input impedance as seen by an external circuit.

For potential values below $V_1$, the impedance of junction **16*a* in either case is so high, compared to the impedance of junction 16*b*, that little change in current through junction 16*a* takes place and hence there is little change in the collector current. In the region between $V_1$ and $V_2$, let us consider first the case of FIG. 6A. Considering that the circuit is operated by varying the input current, then at a current value $I_1$, an unstable region is reached where the potential shifts suddenly between $V_1$ and a value $V_3$ somewhat greater than $V_2$. In the region where the potential is higher than $V_3$, both the conventional diode junction portion 16*a* and the Esaki diode junction portion 16*b*** have positive resistances, and the increasing potential is accompanied by an increasing current flow with typical transistor amplification appearing at the collector.

Since the input impedance in FIG. 6A has a negative resistance region, the transistor 11 may be employed, with suitable external circuit elements, to provide a negative resistance oscillator.

Considering the case of FIG. 6B, it may be seen that the emitter potential is a single-valued function of the current, and hence any oscillations which may occur are generated internally in the semiconductor device.

Referring to the collector potential-current characteristics shown in FIG. 7, note that the family of curves for low emitter current is closely bunched, as shown at 29. As the emitter current increases above $I_1$ in FIGS. 6A and 6B, the collector potential-current characteristics curves suddenly become more widely spaced, as shown at 30, indicating substantial amplification in the circuit.

Considering the case of FIG. 6A, the battery 21 and resistor 20 are selected to supply to the emitter electrode 18 a current smaller than $I_1$, then the circuit may be used as a switch, being turned on by any input signal which will carry the emitter current above $I_1$, and turned off by any input signal which will carry the emitter current below $I_2$. The circuit may therefore serve as a level setter, setting at the value $I_1$ the level of the input signal current effective to deliver an output signal.

If battery 21 and resistor 20 are selected so that the emitter electrode 18 receives a current greater than $I_1$, then the circuit operates as a typical amplifier, amplifying any input signal introduced at terminal 24. When used as an amplifier, the circuit has very low base resistance and consequently is suitable for higher frequencies than circuits having more conventional values of base resistance. Even though the transition capacitance of the Esaki diode is high, the area of that diode can be made small to reduce that transition capacitance and secure a very high frequency response.

*FIG. 8*

This figure illustrates a diode 31 employing structures and principles similar to those in the emitter-base junction in the transistor 11 of FIG. 4. Those elements corresponding in structure and function to their counterparts in FIG. 4 have been given the same reference numerals.

Electrode 18 serves as the anode of the diode 31. A contact 32 on the opposite side of region 13 from junction **16*a*** serves as the cathode.

The characteristics of the diode 31 are similar to those illustrated in FIGS. 6A and 6B for the emitter-base junction of the transistor 11. The overall characteristic, including both portions of the junction, shows a sudden shift when the potential $V_1$ is passed.

The diode 31 may alternatively be used as a light sensitive device, in which case a similar sudden shift is observed at a threshold value of illumination. When so used, the ohmic contact 17 may be used as a cathode, and the light may be directed on the end of region 13 opposite the barrier junctions.

The N region 13 acts as a resistance in series with the junction of diode 31. The effect of this resistance on the potential-current characteristics of the diode may be observed in FIG. 8A, where 28*a* corresponds to the curve 28*a* of FIG. 6A, and 28*c* illustrates the potential-current characteristic taken across the diode 31 of FIG. 8. The resistance of N region 13 shifts the characteristic to the right, since the potential drop through that region is in series with the drop across the junction.

When minority carriers are injected in region 13, the resistance thereof is reduced to a lower value. Such minority carrier injection may be produced by a heavy input current pulse or by intense illumination. The minority carriers effectively eliminate the series resistance and shift the characteristic back to curve 28*a*.

Figure 11:
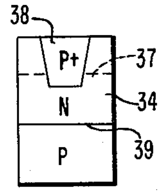
FIG. 11 is a diagrammatic illustration of a further step in the process of constructing the device of FIG. 4.

*FIGS. 9 to 11*

There is illustrated diagrammatically in these figures a presently preferred process for making a transistor such as that illustrated in FIG. 4. The process starts with a PN junction diode 33 shown diagrammatically in FIG. 8, having an N region 34 and a P region 35, separated by a junction 39. The N region 34 has a graded concentration of impurities ranging from a value higher than $10^{19}$ at the upper surface of the diode down to substantially $10^{14}$ at the PN junction. The variation of impurity concentration over the vertical dimension of the N region is illustrated in the graphical FIG. 10 by the curve 36.

Such a diode as described in FIGS. 9 and 10 may be produced by the process described in the patent to L. P. Hunter, et al., No. 2,810,870, granted October 22, 1957, starting with a block of germanium having a suitable P type impurity of a concentration in the nondegenerate range. A suitable N type impurity is then diffused into the germanium block from all of its surfaces, the diffusion being allowed to proceed until the material at the surfaces of the germanium block is degenerate. The germanium block is then cut into sections and the N type material is removed, as by etching, from one side of the P type material, leaving the diode as shown in FIG. 9.

The N region 34 is degenerate above the dotted line 37, which corresponds to the point at which the curve 36 in FIG. 10 crosses the abscissa corresponding to $10^{19}$ atoms per cubic centimeter.

Taking the diode of FIG. 9, the next step is to alloy into a portion of the upper surface of the N region an impurity material which will induce P type conductivity and at a concentration which will make the material degenerate in the region 38. A suitable P type impurity material is the intermetallic compound tin gallium (SnGa).

The alloying process for producing the P+ region 38 must proceed long enough to enable the alloying to go through the boundary 37 of the degenerate material, but it must not go through the N region 34 to the junction 39. This alloying process has been successfully carried out by supporting the PN junction diode 33 on an electrical resistance heater, with a small dot of the impurity material resting on the top of the diode. The operation preferably takes place under a bell jar or in some other suitable enclosure. Heat is applied to the diode by energizing the resistance element, and the dot of impurity material is watched until it melts and wets the surface of the diode. This heating preferably is done rapidly, i.e., in a few seconds. The heat is then turned off and the diode allowed to cool at room temperature. The cooling takes place in a few seconds, and is sufficiently fast to produce the PN junction characteristics described above.

Figure 12:
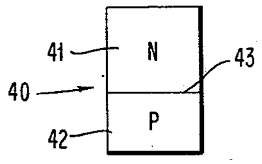
FIGS. 12, 13 and 14 are diagrammatic illustrations of successive steps in a different process of making the device of FIG. 4.
Figure 13:
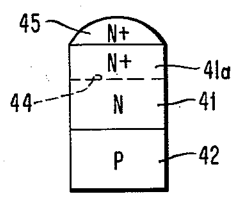
Figure 14:
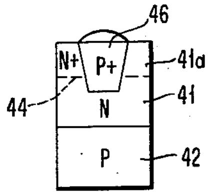

*FIGS. 12 to 14*

These figures illustrate another method of producing the transistor device of FIG. 4. This process starts with a PN junction diode 40 including an N region 41 and a P region 42 separated by a junction 43. Both regions are of nondegenerate material. A suitable impurity material, for example, tin arsenic, which is effective to produce degenerate N type semiconductor material is placed on the top of the N region 41. The diode is then heated, as described above, thereby converting the top end of the N region 41 into degenerate N+ material, separated from the N type material by a boundary indicated at 44. The degenerate N+ region is indicated by the reference numeral 41*a*. If this step of the process is carried out with sufficiently rapid heating and cooling, it is possible to produce a more rapid variation of the impurity concentration at the boundary 44 than is possible with the method described in FIGS. 9 to 11 at the boundary 37. Such a rapid variation may provide better emitter characteristics for the conventional diode portion of the junction.

The excess impurity material 45 is then etched away, leaving a semiconductor device of three regions 41*a*, 41 and 42. A P+ region 46 is then alloyed into the center of the region 41*a*, extending through that region and through the boundary 44 into contact with the N region 41. This final alloying step may be the same as the final alloying step described above in connection with FIG. 11.

After completing either of the processes described in FIGS. 9–11 and FIGS. 12–14, a portion of the N+ region 41*a* (or the corresponding region) may be etched away as may be desired to control the ratio of the area of the Esaki diode junction portion to the area of the conventional diode junction portion.

Diodes such as that illustrated in FIG. 8 may be made by either the process of FIGS. 9 to 11 or the process of FIGS. 12 to 14, the only necessary changes being to omit the unnecessary P region (35 or 42) at the beginning, or to remove it at some later stage in the process.

Figures 8A, 15, 16, 17:
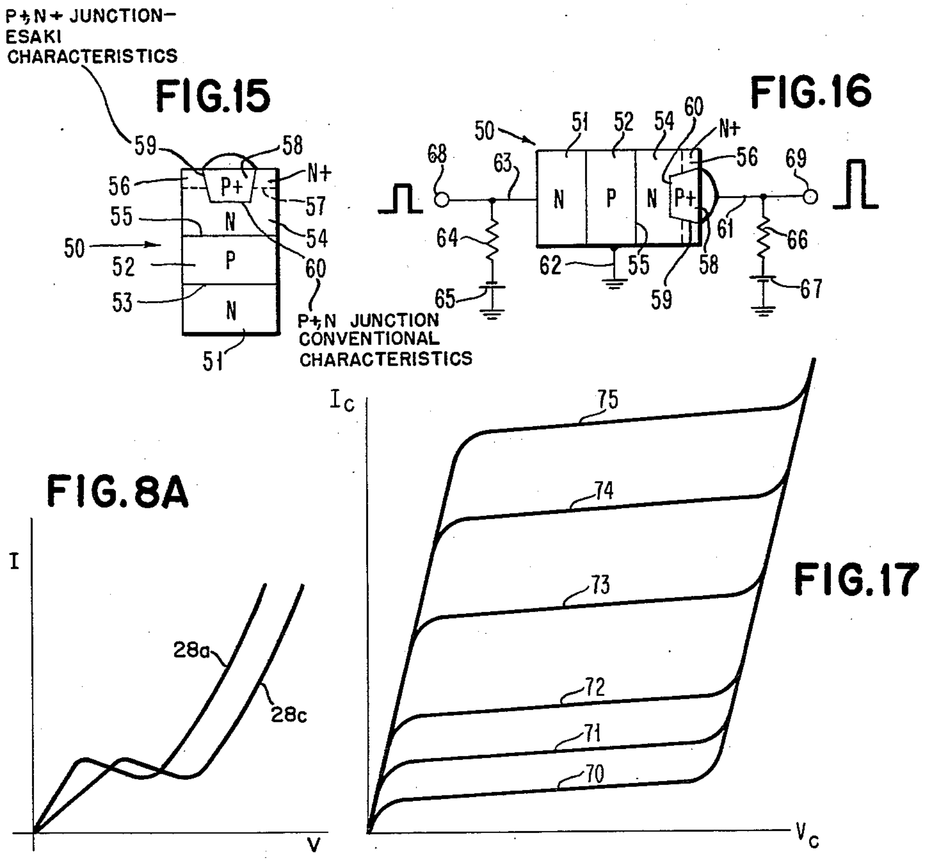
FIG. 8A is a graphical comparison of one of the curves of FIG. 6A with the potential-current characteristic of the diode of FIG. 8.
FIG. 15 is a diagrammatic illustration of a modified form of semi-conductor device embodying the invention.
FIG. 16 is a wiring diagram of a circuit utilizing the device of FIG. 15.
FIG. 17 is a graphical illustration of the collector potential-current characteristics of the device of FIG. 15.

*FIGS. 15 to 17*

There is shown in FIG. 15 a semiconductor device or transistor 50 which may be similar in structure to the transistor 11 of FIG. 4, except that there is provided an additional N region 51. The N region 51 is separated from a P region 52 by a boundary junction 53. The region 53 is separated from another N region 54 by a second boundary junction 55. The regions 51, 52 and 54 are nondegenerate. The upper end of the region 54 adjoins a region 56 of degenerate N type material. The boundary between these two regions is indicated by the dotted line 57. A central region of P type degenerate semiconductor material is indicated by the reference numeral 58 and extends through the region 56 and into contact with the region 54. The PN junction which defines the boundary of region 58 includes an Esaki diode portion 59 between regions 58 and 56 and a conventional diode portion 60 between regions 58 and 54. As shown in FIG. 16, an electrode 61 is ohmically connected to the region 58. Another electrode 62 is ohmically connected to the region 52. A third electrode 63 is ohmically connected to the region 51. When the device is connected as shown in FIG. 15, electrodes 61, 62 and 63 serve as collector, base and emitter electrodes respectively.

Electrode 62 is connected to ground in FIG. 16. Emitter electrode 63 is connected through a resistor 64 and a battery 65 to ground. Collector electrode 61 is connected through a resistor 66 and a battery 67 to ground. An input signal may be applied to a terminal 68 connected to the emitter electrode 63. An output terminal 69 is connected to collector electrode 61.

In accordance with the usual mode of operation of PN hook collector transistors, the polarity of the battery 67 is selected to reverse bias the junction 55, at which the collector action primarily takes place. The Esaki diode portion 59 of the junction adjoining the region 58 and the conventional diode portion 60 of that junction are both forwardly biased. At low collector currents, these junction portions act together to provide a low resistance path for the collector current. The transistor 50 then has typical junction transistor characteristics, with an alpha less than 1. As the collector current increases, the potential drop across these two junction portions increases until the critical value $V_2$, representing the valley point of the Esaki diode characteristic, is passed. For collector current values beyond that point, the two junction portions 59 and 60 cooperate as a typical PN junction to provide hook collector action and an alpha greater than 1.

FIG. 17 illustrates a typical family of collector potential-current characteristic curves which may be derived from transistor 50. The curves 70, 71 and 72 are taken at low values and equal increments of emitter current. The alpha for all three of these curves is less than 1. The curves 73, 74 and 75 are taken with higher values of emitter current but with the same increments between curves, in the region where the alpha is greater than 1.

The circuit of FIG. 16 is a non-linear amplifier, since its amplifies input signals of less than a predetermined magnitude with one value of gain and amplifies signals greater than that magnitude with a larger value of gain.

Although all the semiconductor devices described herein are shown with nondegenerate and degenerate N regions both adjoining a degenerate P region, it will be recognized by those skilled in the semiconductor art that equivalent results may be secured with devices incorporating nondegenerate and degenerate P regions both adjoining a degenerate N region, providing appropriate changes are made in biasing potentials.

While I have shown and described certain preferred embodiments of my invention, other modifications thereof will readily occur to those skilled in the art, and I therefore intend my invention to be limited only by the appended claims.

I claim:

1. A semiconductor device comprising a body of semiconductor material including a first region of one extrinsic conductivity type and of degenerate material, a second region of the opposite extrinsic conductivity type and of degenerate material and a third region of said opposite type and of nondegenerate material, said first region being separated from said second and third regions by a boundary junction including a portion between said degenerate regions and having Esaki diode characteristics and a portion between said first region and said third region and having conventional diode characteristics.

2. A transistor comprising a body of semiconductor material including first and second non-degenerate regions of opposite extrinsic conductivity types separated by a barrier junction, a third region adjoining said second region and of the same conductivity type, said third region being of degenerate semiconductor material, and a fourth region of degenerate semiconductor material of extrinsic conductivity type opposite to said third region, said fourth region adjoining said second and third regions and being separated from said second region by a first barrier junction portion having conventional diode current characteristics and from said third region by a second barrier junction portion having Esaki diode potential-current characteristics.

3. A transistor as defined in claim 2, in which said body includes a fifth region adjoining said first region and of opposite conductivity type with respect thereto and separated therefrom by a barrier junction.

4. A transistor as defined in claim 3, including electrical connections to said first, fourth and fifth regions and adapted to serve as base, collector and emitter electrodes, respectively.

5. An electric circuit comprising a body of semiconductor material including first and second nondegenerate regions of opposite extrinsic conductivity types separated by a first barrier junction, a third region adjoining said second region and of the same conductivity type as said second region, said third region being of degenerate semiconductor material and a fourth region of degenerate semiconductor material of extrinsic conductivity type opposite to said third region, said fourth region adjoining said third and second regions and being separated therefrom by a second barrier junction including a first portion between said fourth and second regions and having conventional diode potential-current characteristics and a second portion between said fourth and third regions and having Esaki diode potential-current characteristics; first, second and third electrical contacts to said first, third and fourth regions respectively, output circuit means connected between said first and second contacts, and input circuit means connected between said third and second contacts.

6. An electric circuit comprising a body of semiconductor material including first and second nondegenerate regions of opposite extrinsic conductivity types separated by a first barrier junction, a third region adjoining said second region and of the same conductivity type as said second region, said third region being of degenerate semiconductor material, and a fourth region of degenerate semiconductor material of extrinsic conductivity type opposite to said third region, said fourth region adjoining said third and second regions and being separated therefrom by a second barrier junction including a first portion between said fourth and second regions and having conventional diode potential-current characteristics and a second portion between said fourth and third regions and having Esaki diode potential-current characteristics including, in the forwardly biased section thereof: a first, positive-resistance portion extending over a range of low potentials; a second, negative-resistance portion extending over a range of potentials higher than that of the first portion; and a third, positive-resistance portion extending over a range of potentials higher than that of the second portion; first, second and third electrical contacts to said first, third and fourth regions respectively, output circuit means connected between said first and second contacts, and input circuit means connected between said third and second contacts, said input means including means biasing said third contact to a potential lower, with respect to the second contact than that of said third portion of the potential-current characteristics, and signal input means effective at times to supply potential signals of an amplitude effective to swing said third contact to a potential in said third portion, said transistor being effective at such times to switch the output circuit means from a low current condition to a high current condition.

7. An electric circuit comprising a body of semiconductor material including first and second nondegenerate regions of opposite extrinsic conductivity types separated by a first barrier junction, a third region adjoining said second region and of the same conductivity type as said second region, said third region being of degenerate semiconductor material, and a fourth region of degenerate semiconductor material of extrinsic conductivity type opposite to said third region, said fourth region adjoining said third and second regions and being separated therefrom by a second barrier junction including a first portion between said fourth and second regions and having conventional diode potential-current characteristics and a second portion between said fourth and third regions and having Esaki diode potential-current characteristics including, in the forwardly biased section thereof: a first, positive-resistance portion extending over a range of low potentials; a second, negative-resistance portion extending over a range of potentials higher than that of the first portion; and a third, positive-resistance portion extending over a range of potentials higher than that of the second portion; first, second and third electrical contacts to said first, third and fourth regions respectively, output circuit means connected between said first and second contacts, and input circuit means connected between said third and second contacts, said input means including means biasing said third contact to a potential with respect to the second contact, which lies within said third portion of the potential-current characteristics, and signal input means effective to supply potential signals between said third and second contacts, said transistor being effective in response to said input signals to produce amplified signals in said output circuit means.

8. An electric circuit comprising a body of semiconductor material including first and second nondegenerate regions of opposite extrinsic conductivity types separated by a first barrier junction, a third region adjoining said second region and of the same conductivity type as said second region, said third region being of degenerate semiconductor material, and a fourth region of degenerate semiconductor material of extrinsic conductivity type opposite to said third region, said fourth region adjoining said third and second regions and being separated therefrom by a second barrier junction including a first portion between said fourth and second regions and having conventional diode potential-current characteristics and a second portion between said fourth and third regions and having Esaki diode potential-current characteristics; and a fifth region adjoining said first region and of opposite conductivity type with respect thereto and separated therefrom by a third barrier junction; electrical connections to said first, fourth and fifth regions and adapted to serve as base, collector and emitter electrodes respectively; output circuit means connected between said base and collector electrodes and including means to bias said first barrier junction reversely and said second barrier junction forwardly; and input circuit means connected to said base and emitter electrodes and effective to vary the current flow therebetween, and thereby to vary the current flow through the collector electrode, said collector current being effective as it varies to vary the potential across said second junction portion and thereby to switch the transistor between a low current region wherein its alpha is less than unity and a high current region wherein its alpha is greater than unity.

9. A semiconductor device comprising a body of semiconductor material, including:

(*a*) a first region of one extrinsic conductivity type and of degenerate material;

(*b*) a second region of the opposite extrinsic conductivity type and also of degenerate material; and (*c*) a third region of said opposite type and of nondegenerate material;

(*d*) said first region being defined completely by:

(1) an external surface of said body;

(2) a boundary junction portion between said first and second regions having a thickness of the order of 150 Angstrom units or less and having Esaki diode characteristics, and (3) a boundary junction portion between said first region and said third region and having conventional diode characteristics.

10. A semiconductor device comprising a body of semiconductor material, including:

(*a*) two regions of opposite extrinsic conductivity types separated by a boundary junction;

(*b*) said semiconductor material being inhomogeneously doped along said junction;

(*c*) said doping being sufficient in a portion only of the junction to make both regions degenerate;

(*d*) said portion of the junction having a thickness of the order of 150 Angstrom units or less;

(*e*) said doping and said thickness cooperating to produce Esaki diode characteristics in that portion of the junction; and (*f*) the remainder of the junction having conventional diode characteristics.

References Cited in the file of this patent

UNITED STATES PATENTS

| | | |
|---|---|---|
| 2,778,956 | Dacey et al. | Jan. 22, 1957 |
| 2,878,148 | Beale | Mar. 17, 1959 |
| 2,879,409 | Holt | Mar. 24, 1959 |
| 2,894,152 | Anderson | July 7, 1959 |
| 2,894,862 | Mueller | July 14, 1959 |
| 2,954,307 | Shockley | Sept. 27, 1960 |

OTHER REFERENCES

H. S. Sommers, Jr.: "Tunnel Diode as High Frequency Devices," Proc. I.R.E., July 1959, pages 1201–1206.

Sklar: article, Electronics, November 6, 1959, pages 54–57.